Oct. 11, 1960 C. E. CADY 2,956,161
AUTOMATIC TUNING SYSTEM
Filed June 11, 1959

INVENTOR:
CHARLES E. CADY,
BY Joseph Levinson
HIS ATTORNEY.

United States Patent Office 2,956,161
Patented Oct. 11, 1960

2,956,161

AUTOMATIC TUNING SYSTEM

Charles E. Cady, North Syracuse, N.Y., assignor to General Electric Company, a corporation of New York Filed June 11, 1959, Ser. No. 819,581

6 Claims. (Cl. 250—40)

Figure 1:
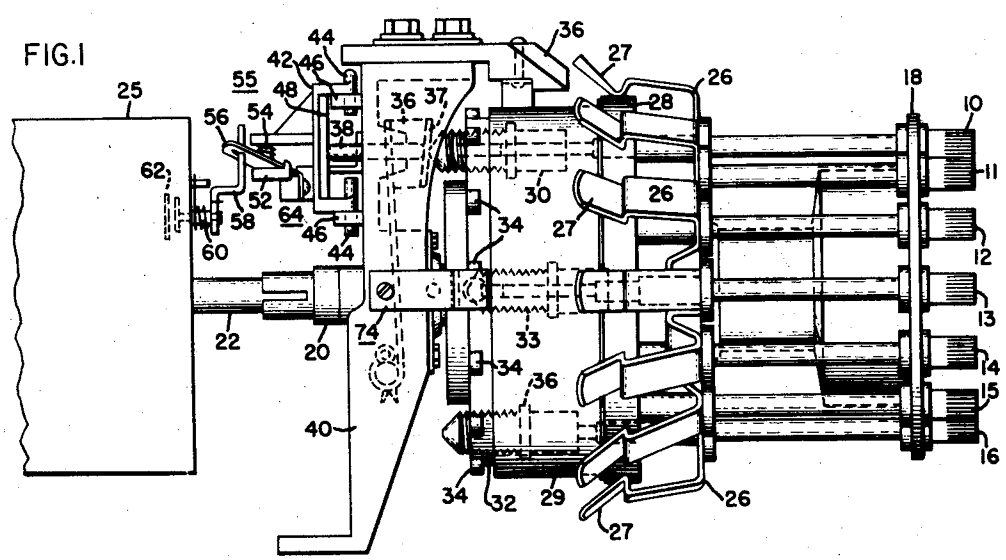

This invention relates to a tuning system for a television receiver, and more particularly to a tuning system having a programmer for preselecting predetermined television channels automatically.

In a co-pending application titled "Automatic Tuning System," Serial Number 730,896, now Patent No. 2,901,615 and in a related co-pending application entitled "Fine Tuning Mechanism," Serial Number 730,895, now Patent No. 2,934,964 which are assigned to the assignee of the present invention, an automatic tuning system is disclosed which provides for automatic channel selection and automatic fine tuning in a television receiver. In the aforesaid system, a motor driven channel selector means is provided with a plurality of push buttons each of which represent a predetermined television channel. To select any given channel, the push button corresponding to that channel is depressed causing the channel selector means to be automatically rotated to the channel desired. The requisite switching to obtain the proper channel is provided by a conventional television tuner which is well known to those skilled in the art. The aforesaid system also provides for automatic fine tuning for each channel. This is accomplished by a variable impedance element connected in the tuner circuit which is adapted to vary the frequency in the tuner over a predetermined range. Each push button is provided with a fine tuning screw, the setting of which is transmitted by a fine tuning linkage means to the variable impedance element in the tuner for the adjustment thereof.

The aforesaid tuning system requires the viewer to press the push button of the channel desired. It would be convenient for the viewer to be able to control the channel selection remotely from points other than the channel selector on the set. Furthermore, since a limited number of television channels are available to the viewer in a given area, it would be convenient to be able to preselect at will only those television channels which the television receiver is capable of receiving.

Accordingly, it is an object of this invention to provide an improved automatic tuning system having a programming means for preselecting any number of desired channels.

A further object of this invention is to provide an improved tuning system having a programming means for preselecting desired channels, which channel selection is capable of being remotely controlled. Still another object of this invention is to provide an improved automatic tuning system which may be set to receive desired channels in a manner which will be readily adaptable to presently available tuning systems without incurring great additional cost.

In carrying out this invention a motor driven tuner is provided with an adjustable fine tuning means which is capable of being adjusted and set for each television channel. A fine tuning linkage means is provided for coupling the settings of the fine tuning means to a variable impedance element in the tuner for varying the frequency of the tuner in accordance with the settings of the fine tuning means. Motor switch means are associated with the fine tuning means and fine tuning linkage means for stopping the motor when a given channel is selected in accordance with the setting of the fine tuning means. The motor may be remotely controlled to stop on a given channel or on a plurality of channels in accordance with the number of channels fine tuned by a setting of the fine tuning means.

These and other advantages of this invention will be more clearly understood from the following description taken in connection with the accompanying drawings, and its scope will be apparent from the appended claims.

Figure 2:
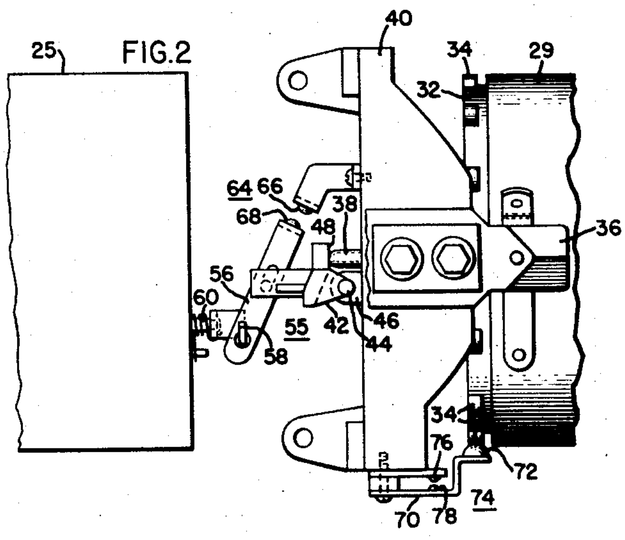
Figure 3:
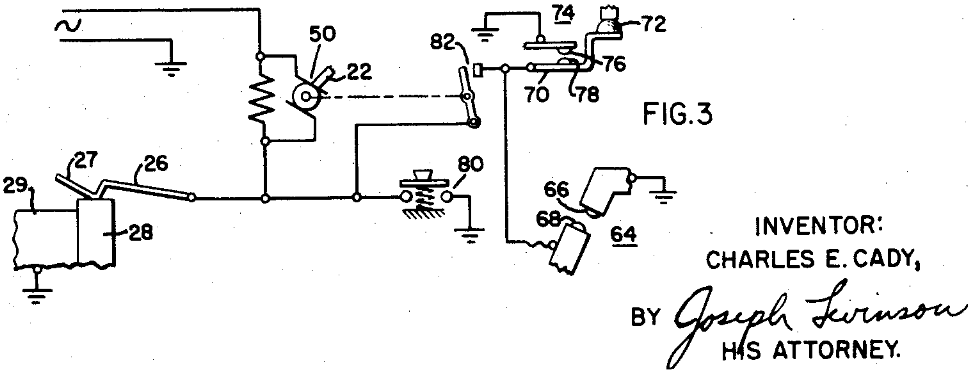

In the drawings:

Figure 1 is a side elevational view of the automatic tuning system embodied in this invention, Figure 2 is a partial top view of the automatic tuning system shown in Figure 1 and Figure 3 is a schematic diagram of the programmer circuit for the automatic tuning system of Figure 1.

Since the programming circuit embodied in this invention is adapted to be utilized in an automatic tuning system such as disclosed in the aforesaid applications, it is herein described in connection with such a system. In order to simplify the explanation of this invention, much of the detailed construction of the automatic tuning system of the aforesaid applications is omitted, but may be readily obtained by referring to the aforesaid applications. However, the present invention is not limited to the exact structure of those applications as will be pointed out subsequently.

Referring now to Figure 1, a plurality of push buttons 10, 11, 12, 13, 14, 15 and 16 are mounted in a channel selector knob 18 which is in turn mounted on a control shaft 20. It should be appreciated that normally a minimum of twelve push buttons are required for selecting the twelve channels available in the television band and further that an additional push button may be provided for selecting the ultra-high frequency band. The control shaft 20 is coupled to a tuner shaft 22 of a tuner 25. The tuner 25 is of conventional form well known to those skilled in the art. It is assumed that the necessary electrical circuits and means for properly switching these circuits including the tuner shaft 22 are provided in the tuner 25 such that when the channel selector push buttons are depressed to select a particular television channel that the tuner 25 has the circuitry for providing the desired frequency range of the channel selected.

Each push button has associated therewith a spring contact 26. The spring contacts 26 are mounted on the shaft 20 for electrical contact therewith. Each spring contact 26 is provided with a latching finger 27 which normally rests on the periphery of an insulated bearing disc 28. The latching fingers 27 are so formed that a tension is provided in the spring contacts when the fingers thereof rest on the bearing disc 28. A collector ring 29 is mounted on the bearing disc 28. The collector ring 29, and the bearing disc 28 have a plurality of openings therethrough to accommodate the passage of the push buttons 10—16 therethrough. The fingers 27 of the spring contacts 26 are adapted to latch into engagement with the collector ring when pushed forward by an associated push button with the knee of the fingers bearing on the collector ring 29. A shoe 36 is mounted on a frame 40 and is adapted to release any spring finger coming into contact therewith when the selected channel is reached by the rotation of the control shaft.

A motor 50 shown schematically in Figure 3 is coupled to and drives the tuner shaft 22 of the tuner 25 when actuated by a depressed push button thereby pushing the latching finger into engagement with the collector ring 29 which is grounded. The circuit of the motor 50 is completed and the tuner shaft 22, the control shaft 20, the collector ring 29 and the spring contacts 26 are all rotated until the latching finger 27 reaches the shoe 36 at which time it is disengaged, and the circuit for the motor 50 is opened thereby stopping the rotation of the various elements. This point corresponds to the selection of the channel corresponding to the particular push button which has been depressed. This particular manner of selection has been covered in detail in the aforesaid application Serial Number 730,896, and forms no part of this invention.

The tuning system disclosed in the aforesaid applications also provides a fine tuning means with which the present invention is associated with to provide the requisite programming. Fine tuning is accomplished by a variable impedance element connected in the tuner circuit which may vary the frequency in the tuner over a predetermined range. Such elements are provided in conventional tuners presently utilized in the art.

The fine tuning structure includes a plurality of fine tuning screws 30, 33 and 36 which are mounted in a plurality of threaded holes in a fine tuning disc 32. While only three fine tuning screws are shown in Figure 1, it should be understood that each channel to be tuned is provided with a fine tuning screw which may be set in a given position to accomplish fine tuning in a manner to be described subsequently. In Figure 1, the fine tuning screws 30, 33 and 36 are adapted to be adjusted by rotation of the push buttons 10, 13 and 16, respectively. Each fine tuning screw is provided with a channel therein adapted to receive the tongue portion of its associated push button. The tongue portion of each associated push button is adapted to be slideably mounted within the channel of the fine tuning screw such that the fine tuning screw is rotated by the rotation of its corresponding push button. The fine tuning disc 29 is mounted and adapted to be rotated by the control shaft 20.

A fine tuning linkage means 55 is provided which is the same as that disclosed in application Serial Number 730,-895, now Patent No. 2,934,964, except as has been modified by this invention. The fine tuning linkage means 55 functions to transmit the setting of any given fine tuning screw to a variable impedance element 62 in the tuner 25, the impedance of which is determined by the setting of the fine tuning screw. The fine tuning linkage means 55 includes a fine tuning guide 36 having a generally horse-shoe shape with a generally V-shaped intermediate or base portion 37 and a pair of legs which terminate in eyelets which are mounted on a mounting plate 40. The fine tuning screws are adapted to come into contact with one side of the base portion 37 of the fine tuning guide 36 while a pin 38 which is mounted in a hole in the mounting plate 40 contacts the other side of the base portion 37. The fine tuning guide 36 and the guide pin 38 may be considered to be floating elements which are freely movable by the settings of the fine tuning screws. The other end of the guide pin 38 bears on a bearing surface 48 of a swivel plate 42. The swivel plate is provided with pins 44 which are adapted to be received in flanges 46 which are a unitary part of the mounting plate 40. The swivel plate 42 is provided with a leg portion having a shoe 52 thereon. A spring 54 is mounted on the leg portion. A link 56 having a hole in an intermediate portion thereof is adapted to be mounted on the leg of the swivel plate by slipping the opening over the shoe 52. The shoe 52 and the spring 54 retain the link on the leg of the swivel plate 42. The link 56 has an electrical contact 68 on one end portion thereof. An associated electrical contact 66 is mounted on the mounting plate 40 which is adapted at predetermined times to make contact with the contact 68 thereby providing a switch 64. The other end of the link 56 is coupled to a capacitor arm 58. The capacitor arm 58 is connected at the other end thereof to a shaft 60 for driving the movable plate of the variable impedance element 62 in the tuner 25. The capacitor arm is spring loaded. Another switch 74 having a pair of contacts 76 and 78 is mounted on the mounting plate 40. The contact 76 is stationary while the contact 78 is movable by the flexible arm 70 having a bearing surface 72 on one end portion thereof. The arm 70 may be a number of different shapes or be positioned on various locations on the mounting plate 40. The fine tuning mounting disc has a plurality of spaced ridges 34 on an outer portion thereof adapted to be contacted by the bearing surface 72 of arm 70. The spaced ridges 34 on the fine tuning mounting disc 32 are so positioned that they correspond to a detented position of a particular television channel. Accordingly, each television channel is provided with a corresponding ridge 34. When the fine tuning disc 32 is rotated the switch 74 is opened each time the bearing surface 72 rides on one of the ridges 34. Likewise switch 64 opens each time a fine tuning screw contacts the fine tuning guide 36.

In order to provide fine tuning in the aforesaid system, the push button of the channel selected is rotated which in turn rotates its associated fine tuning screw. For example, in Figure 1 a channel represented by the push button 10 has been selected and is in position for a fine tuning adjustment. The adjustment is made by rotating the push button 10 which rotates the fine tuning screw 30. Fine tuning screw 30 bears on the V-shaped base portion 37 of the tuning guide 36 which in turn bears on the pin 38. The pressure exerted by the fine tuning screw 30 on the tuning guide 36 is transmitted by the pin 38 to the bearing surface 48 of the swivel plate 42. The swivel plate 42 rocks a predetermined amount in accordance with the pressure exerted thereon by the fine tuning pin 38. The rockable motion about the axis of the swivel plate moves the link 56 a predetermined amount. Movement of the link 56 is transmitted into rotatory motion by the capacitor arm 58 which is coupled to the shaft 60. The capacitor arm 58 and the shaft 60 are rotated in accordance with the pressure exerted by the pin 38 on the bearing surface 48 of the swivel plate 42. Rotation of the shaft 60 causes the rotation of the movable element of the variable impedance element 62 to vary the impedance thereof and accordingly the frequency of the tuner on the particular channel selected.

The present invention relates to a programming means for preselecting any given number of television channels. The switches 64 and 74 which appear on Figure 2 are part of this means. Figure 3 shows a schematic diagram of the electrical circuit comprising the programming means for the aforesaid system. The circuit includes the motor 50 which is adapted to drive the tuner shaft 22 and in turn the control shaft 20. The motor 50 is provided with an armature switch which is adapted to be activated when power is applied to the motor 50. This type of switch is conventional and well known in the art. As will be seen from Figure 3, a pair of switches are provided which are connected in parallel either of which may apply an operating potential to the motor 50. One of these switches has already been described and is composed of the spring contact 26 and the collector ring 29 which may be activated by pressing a push button to force the contact finger 27 of the spring contact 26 into engagement with the collector ring 29 thereby applying ground to one side of the motor circuit to complete said circuit and apply an operating potential to the motor 50. A second switch 80 which is referred to as a remote switch is likewise adapted to ground on one side of the motor 50 to thereby apply an operating potential thereto. The remote switch 80 may be connected by a length of cord in the circuit as shown whereby the viewer may operate the switch directly from his viewing point in a room. The remote switch 80 might also be activated remotely by a sonic or radio transmitter whose signals are picked up by a receiver adapted to receive those frequencies to close the switch 80 which may be a relay thereby placing a potential on and operating the motor 50. It will be noted that when either of the aforesaid switches closes the motor circuit 50 that the armature switch is activated to place the switches 74 and 64 in the motor circuit. Accordingly, once a push button is depressed to complete the motor circuit or when the remote switch 80 is momentarily closed to complete the motor circuit, these switches then lose control and switches 74 and 64 control the time at which the motor circuit is to be opened. From Figure 2 it can be seen that the switch 64 is open when a channel is fine tuned by moving the fine tuning screw corresponding to that channel into contact with the fine tuning guide 36. On the other hand switch 74 is open only when passing through each of the television channels. Consequently, the switch 64 may be used as a means for preselecting a given television channel by setting that particular channel for fine tuning. Note in Figure 1 that the fine tuning screw 30 is set to come into contact with the fine tuning guide 36. In operation, the motor 50 rotates the tuner shaft 22 and the control shaft 20 until the fine tuning screw 30 comes into contact with the fine tuning guide 36 which rocks the swivel plate 42 and opens the switch 64. Switch 74 also opens when it comes into contact with the ridge for that channel. The switch 74 provides a safety factor so that the motor stops at the proper time and does not stop either before or after the desired channel is reached. Note that fine tuning screw 33 in Figure 1 is not adjusted for fine tuning, and accordingly does not hit the fine tuning guide 36. Accordingly, the motor rotates the control shaft right by the fine tuning screw 33 because the switch 64 is closed and the fine tuning screw 33 is not set to open that circuit. Even though the switch 74 opens when that channel is reached, the motor continues to operate since one of the switches is continually closed. Accordingly, any number of desired channels can be set by merely setting the fine tuning for the channel desired. As has previously been stated when either a push button is depressed or the remote switch 80 momentarily closed, these switches close the motor circuit, and the switches 64 and 74 then control the channel on which the motor stops.

This invention thus provides a number of alternative methods of channel selection. Any push button may be pushed and only those channels which have been fine tuned are selected. The remote switch 80 may be actuated to select the desired channels, or the set may be manually operated by rotating the entire selector knob. If manual selection is not desired, the armature switch 82 can be eliminated. The armature switch 82 allows the operator to rotate the selector knob manually without actuating the motor circuit. If it was not present and the viewer rotated the channel selector knob, the switches 64 and 74 would immediately take over because the motor circuit would be closed.

Although the present programming system is adapted for use with the systems of the aforesaid applications, the only essential features from those applications required by the invention are a means of presetting each channel for fine tuning, such as fine tuning screws however set, and a fine tuning linkage system which is responsive to those settings. Although one of the contacts of switch 64 is shown mounted on the link 56, it will be appreciated that the contacts of the switch 64 may be positioned on or operated by any of the movable elements of the fine tuning linkage means.

Since other modifications varied to fit particular operating requirements and environments will be apparent to those skilled in the art, the invention is not considered limited to the examples chosen for purposes of disclosure and covers all changes and modifications which do not constitute departures from the true spirit and scope of this invention.

What I claim as new and desire to secure by Letters Patent of the United States is:

1. A tuning system for providing fine tuning and preselection of predetermined television channels automatically comprising in combination, a tuner, a variable impedance element in said tuner for providing fine tuning therefor, adjustable fine tuning means for providing a setting corresponding to a predetermined amount of fine tuning for each of the channels in the television band of frequencies, a fine tuning linkage means coupled between said adjustable fine tuning means and said variable impedance element for transmitting the settings of said adjustable fine tuning means to said variable impedance element for changing the impedance thereof thereby changing the frequency of the channel to which the tuner is operating on, a motor for driving the shaft of said tuner for providing channel selection for said tuner, a motor circuit, means for applying an operating potential to said motor, a first switch means operable by said fine tuning linkage means to open said motor circuit when a setting of said adjustable fine tuning means activates said fine tuning linkage means thereby stopping said motor to select a channel which has been set for fine tuning.

2. The structure defined in claim 1, including a second switch means in parallel with said first switch means, means for opening said second switch means every time a different channel is reached to insure that the motor is stopped at the proper point for the channel which has been fine tuned.

3. The structure set forth in claim 1 wherein said adjustable fine tuning means consists of a plurality of fine tuning screws, and means for adjusting a given screw in accordance with the channel which is to be fine tuned and automatically selected.

4. A tuning system for providing fine tuning which automatically programs a television receiver to receive only those channels which have been fine tuned comprising in combination, a tuner, a tuner shaft, a control shaft coupled to said tuner shaft for rotation therewith, a motor for driving said tuner and control shafts, a motor circuit, means for closing said motor circuit to apply an operating potential to said motor, adjustable fine tuning means for each television channel adapted to provide a predetermined setting for each channel in accordance with the amount of fine tuning desired, mounting means on said control shaft for said adjustable fine tuning means, a variable impedance element in said tuner for providing fine tuning therefor, fine tuning linkage means for coupling the settings of said fine tuning means to said variable impedance element for varying the impedance thereof to thereby vary the frequency of said tuner in accordance with the setting of said fine tuning means, first switch means operative by said fine tuning linkage means to open said motor circuit when a setting from the fine tuning means is coupled by said fine tuning linkage means to said variable impedance element, second switch means associated with said mounting means for opening said motor circuit when each television channel is reached whereby said motor circuit is opened and said motor stopped when both said first and second switch means are in an open position.

5. A tuning system for providing fine tuning which automatically programs a television receiver to receive only those channels which have been fine tuned comprising in combination, a tuner, a tuner shaft, a control shaft coupled to said tuner shaft for rotation therewith, a motor for driving said tuner and control shafts, a motor circuit, means for closing said motor circuit to apply an operating potential to said motor, adjustable fine tuning screws for each television channel adapted to provide a predetermined setting for each channel in accordance with the amount of fine tuning desired, a mounting disc on said control shaft for said adjustable fine tuning screws, a variable impedance element in said tuner for providing fine tuning therefor, fine tuning linkage means for coupling the settings of said fine tuning means to said variable impedance element for varying the impedance thereof to thereby vary the frequency of said tuner in accordance with the setting of said fine tuning means, first switch means operative by said fine tuning linkage means to open said motor circuit when a setting from the fine tuning screws is coupled by said fine tuning linkage means to said variable impedance element, second switch associated with said mounting disc for opening said motor circuit when each television channel is reached whereby said motor circuit is opened and said motor stopped when both said first and second switch means are in an open position.

6. A tuning system for providing fine tuning and preselecting of predetermined television channels automatically comprising in combination, a tuner, a variable impedance element in said tuner for providing fine tuning therefor, adjustable fine tuning screws for providing a setting corresponding to a predetermined amount of fine tuning for each of the channels in the television band of frequencies means for adjusting any one of said fine tuning screws, a fine tuning linkage means coupled between said adjustable fine tuning means and said variable impedance element for transmitting the settings of said adjustable fine tuning means to said variable impedance element for changing the impedance thereof thereby changing the frequency of the channel to which the tuner is operating on, a motor for driving the shaft of said tuner for providing channel selection for said tuner, a motor circuit, means for applying an operating potential to said motor, a first switch means operable by said fine tuning linkage means to open said motor circuit when a setting of one of said fine tuning screws activates said fine tuning linkage means thereby stopping said motor to select a channel which has been set for fine tuning.

No references cited.